(12) United States Patent
Lei et al.

(10) Patent No.: US 11,791,812 B2
(45) Date of Patent: Oct. 17, 2023

(54) ANALOG-TO-DIGITAL CONVERTER, LOW-DROPOUT REGULATOR AND COMPARISON CONTROL CIRCUIT THEREOF

(71) Applicant: REALTEK SEMICONDUCTOR CORP., Hsinchu (TW)

(72) Inventors: Liang-Huan Lei, Hsinchu (TW); Shih-Hsiung Huang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 57 days.

(21) Appl. No.: 17/539,456

(22) Filed: Dec. 1, 2021

(65) Prior Publication Data
US 2023/0048199 A1 Feb. 16, 2023

(30) Foreign Application Priority Data
Aug. 13, 2021 (TW) ................................ 110130032

(51) Int. Cl.
*H03K 5/24* (2006.01)
*G05F 1/575* (2006.01)
*H03K 3/037* (2006.01)
*H03M 1/46* (2006.01)

(52) U.S. Cl.
CPC ............... *H03K 5/24* (2013.01); *G05F 1/575* (2013.01); *H03K 3/0377* (2013.01); *H03M 1/466* (2013.01)

(58) Field of Classification Search
CPC ........ H03K 5/24; H03K 3/0377; G05F 1/575; H03M 1/466; H03M 1/08
USPC .................................................. 341/161, 172
See application file for complete search history.

(56) References Cited

U.S. PATENT DOCUMENTS

| | | | |
|---|---|---|---|
| 10,452,087 B2 * | 10/2019 | Tang ........................ | G05F 1/59 |
| 11,226,645 B2 * | 1/2022 | Hu .......................... | G05F 1/468 |
| 11,444,633 B2 * | 9/2022 | Wang ...................... | G01K 7/00 |
| 2019/0149140 A1 | 5/2019 | Han et al. | |
| 2021/0242877 A1 * | 8/2021 | Wang ...................... | H03M 1/38 |

\* cited by examiner

*Primary Examiner* — Khai M Nguyen
(74) *Attorney, Agent, or Firm* — Birch, Stewart, Kolasch & Birch, LLP

(57) ABSTRACT

A comparison control circuit is adapted to analog-to-digital converters and low-dropout regulators. The comparison control circuit includes a comparator, a Schmitt trigger, a capacitor set and a logic circuit. The comparator is configured to output a comparison signal according to a first input signal and a second input signal, wherein the comparison signal is a first high voltage potential or a first low voltage potential. The Schmitt trigger is configured to output a trigger signal according to the comparison signal and a voltage potential range, wherein the voltage potential range is in a range from the first low voltage potential to the first high voltage potential. The capacitor set is configured to adjust the second input signal when being controlled. The logic circuit is configured to control the capacitor set according to the trigger signal to correspondingly adjust the second input signal.

7 Claims, 6 Drawing Sheets

ANALOG-TO-DIGITAL CONVERTER, LOW-DROPOUT REGULATOR AND COMPARISON CONTROL CIRCUIT THEREOF

CROSS-REFERENCE TO RELATED APPLICATION

This non-provisional application claims priority under 35 U.S.C. § 119(a) to Patent Application No. 110130032 filed in Taiwan, R.O.C. on Aug. 13, 2021, the entire contents of which are hereby incorporated by reference.

BACKGROUND

Technical Field

The present application relates to a comparison control circuit, an analog-to-digital converter having the same and a low-dropout regulator having the comparison control circuit.

Related Art

Comparator is a common semiconductor device whose function is to compare the magnitude of the voltages received at the two input terminal and to output a comparison signal. The comparators are widely applied in various types of circuits, such as analog-to-digital converters (ADCs), analog low-dropout regulators (LDOs), and so on. However, the comparator often outputs unclean comparison signal for the reason that being affected by input signal noise, power noise or larger bandwidth, etc., such that the circuit may occur misjudged problem during the operating process, which in turn leads the circuit to output wrong signals.

SUMMARY

In order to solve the aforementioned problem, the inventor proposes a comparison control circuit. The comparison control circuit includes a comparator, a Schmitt trigger, a capacitor set and a logic circuit. The comparator has a first input terminal, a second input terminal and a first output terminal. The comparator is configured to output a comparison signal at the first output terminal according to a first input signal received at the first input terminal and a second input signal received at the second input terminal, wherein the comparison signal is a first high voltage potential or a first low voltage potential. The Schmitt trigger has a third input terminal and a second output terminal. The Schmitt trigger is configured to output a trigger signal at the second output terminal according to the comparison signal received at the third input terminal and a voltage potential range, wherein the trigger signal is a second high voltage potential or a second low voltage potential, and the voltage potential range is in a range from the first low voltage potential to the first high voltage potential. The capacitor set is configured to adjust the second input signal when being controlled. The logic circuit is configured to control the capacitor set according to the trigger signal to correspondingly adjust the second input signal.

In some embodiments, the comparator is a comparator with single-ended input.

In some embodiments, the first high voltage potential is 1 volt (V), and the first low voltage is 0 volt (V).

In some embodiments, the second high voltage potential is 1 volt (V), and the second low voltage is 0 volt (V).

In some embodiments, the capacitor set comprises a plurality of capacitors from $C_1$ to $C_N$, and each of the plurality of capacitors has a first terminal and a second terminal.

In some embodiments, the first terminal of each of the plurality of capacitors is electrically connected to the second input terminal, and the second terminal of each of the plurality of capacitors is electrically connected to a reference voltage source or a ground selectively when being controlled.

According to some embodiment, an analog low-dropout regulator includes an error amplifier, a pass transistor, a voltage divider circuit and the aforementioned comparison control circuit. The error amplifier has a positive input terminal, a negative input terminal and a third output terminal. The error amplifier is configured to output a control voltage at the third output terminal according to a feedback voltage received at the positive input terminal and a stable reference voltage potential received at the negative input terminal. The pass transistor has a gate terminal, a drain terminal and a source terminal. The pass transistor is configured to output an output voltage at the drain terminal according to the control voltage received at the gate terminal. The voltage divider circuit is configured to divide the output voltage and the feedback voltage, such that a value of the feedback voltage is the same as the stable reference voltage potential, thereby a value of the output voltage is the same as the stable reference voltage potential. The aforementioned comparison control circuit is configured to stabilize the output voltage, wherein the second input terminal is electrically connected to the drain terminal.

In some embodiments, the voltage divider circuit comprises a first voltage dividing resistor and a second voltage dividing resistor, wherein a resistance of the first voltage dividing resistor is much smaller than a resistance of the second voltage dividing resistor.

According to some embodiment, an analog-to-digital converter includes the aforementioned comparison control circuit, wherein the first input signal is an analog input signal, the second input signal is a comparison voltage potential, and the logic circuit is further configured to store and output a digital output signal.

In some embodiments, a capacitance of capacitor $C_i$ in the analog-to-digital converter is twice a capacitance of capacitor $C_{i+1}$, a capacitance of capacitor $C_{N-1}$ is equal to a capacitance of capacitor $C_N$, and wherein $i=1$~$N-2$.

In some embodiments, a capacitor set of the analog-to-digital converter is a capacitive digital-to-analog converter.

In some embodiments, a logic circuit of the analog-to-digital converter is a successive approximation register (SAR)

To sum up, in some embodiments, the comparison control circuit can be applied in various types of circuits, such that the circuit can avoid the noise problem caused by the input signal or power supply during the operating process, thereby ensuring the circuit that outputs a correct and clean signal.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
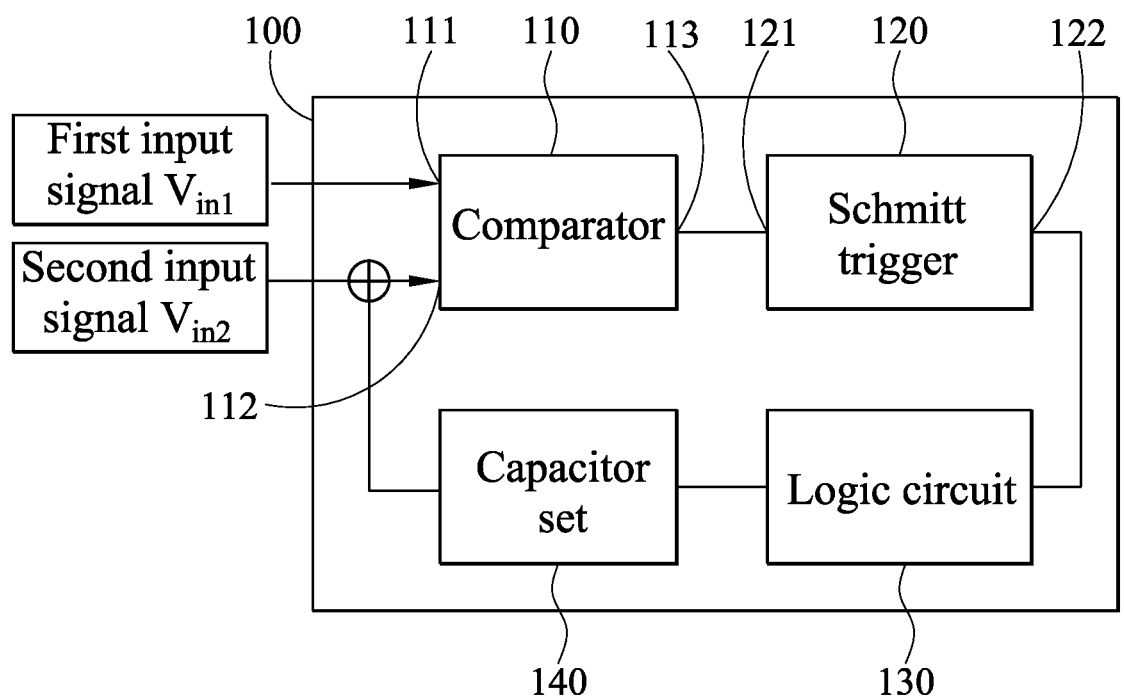
FIG. 1 illustrates a functional block diagram of a comparison control circuit according to an embodiment of the present application.

Some embodiments of the present application are illustrated in the drawings. For the sake of clear illustration, many practical details will be illustrated together in the following description, but this is not to limit the scope of claims of the present application.

Please refer to FIG. 1. FIG. 1 illustrates a functional block diagram of a comparison control circuit 100 according to an embodiment of the present application. The comparison control circuit 100 includes a comparator 110, a Schmitt trigger 120, a logic circuit 130 and a capacitor set 140. The comparator 110 has a first input terminal 111, a second input terminal 112 and a first output terminal 113. The Schmitt trigger 120 has a third input terminal 121 and a second output terminal 122. As shown in FIG. 1, the third input terminal 121 of the Schmitt trigger 120 is electrically connected to the first output terminal 113 of the comparator 110, the logic circuit 130 is electrically connected to the second output terminal 122 of the Schmitt trigger 120, and the capacitor set 140 is electrically connected to the second input terminal 112 and the logic circuit 130.

Figure 2A:
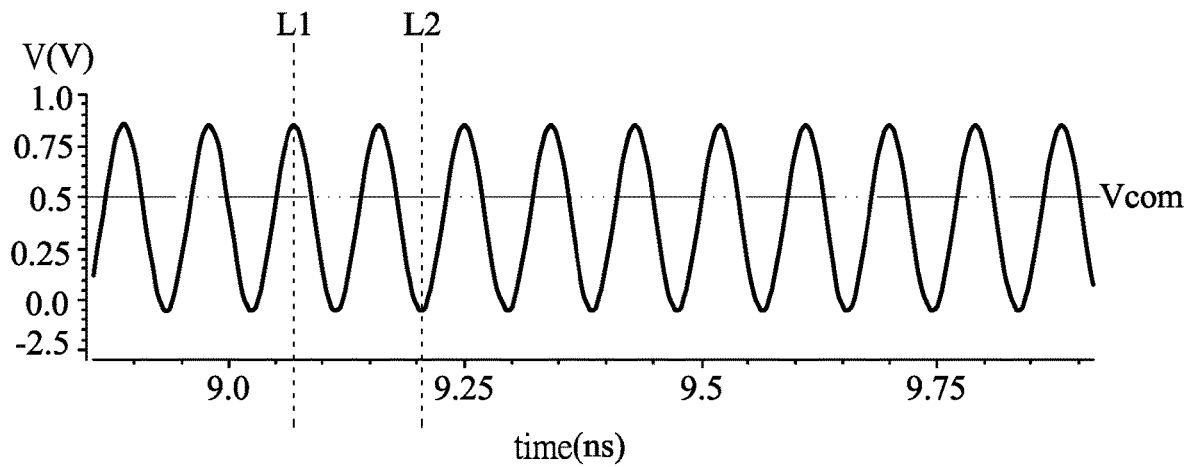
FIG. 2A illustrates a waveform diagram of the voltage of an external input signal received by a comparator of the comparison control circuit according to an embodiment of the present application.
Figure 2B:
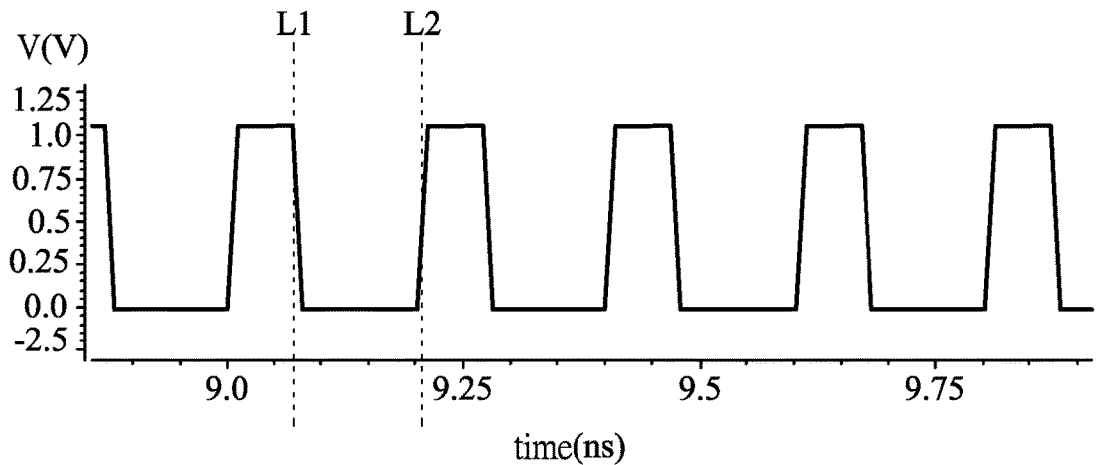
FIG. 2B illustrates a waveform diagram of the voltage of a clock of the comparator of the comparison control circuit according to an embodiment of the present application.
Figure 2C:
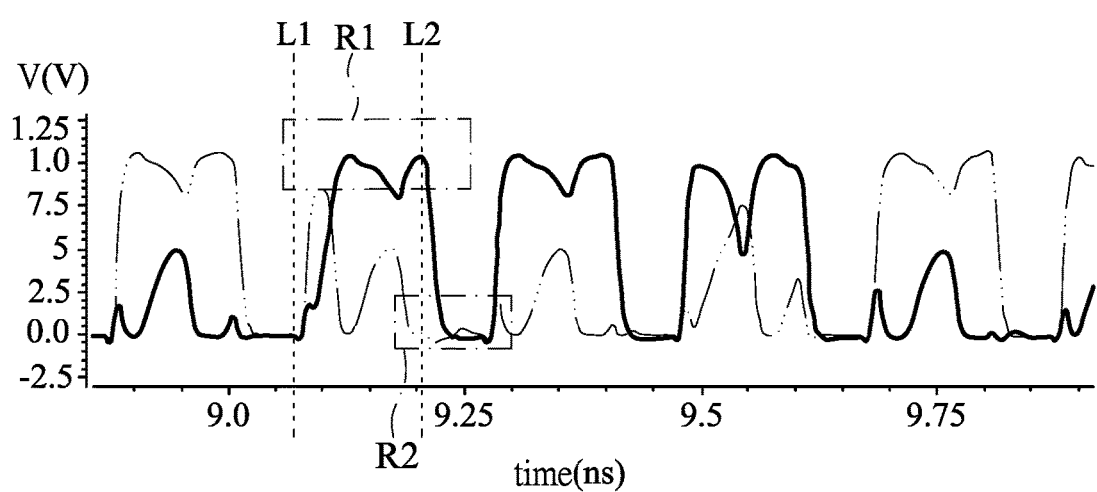
FIG. 2C illustrates a waveform diagram of the voltage of a comparison signal output by the comparator of the comparison control circuit according to an embodiment of the present application.

In some embodiments, the comparator 110 is a comparator with single-ended input, wherein the comparator 110 receives a first input signal $V_{in1}$ at the first input terminal 111 and receives a second input signal $V_{in2}$ at the second input terminal 112. The comparator 110 is configured to compare the first input signal $V_{in1}$ and the second input signal $V_{in2}$ and to output a comparison signal at the first output terminal 113, wherein the comparison signal is a first high voltage potential or a first low voltage potential. Please refer to FIG. 2A, FIG. 2B and FIG. 2C. FIG. 2A illustrates a waveform diagram of the voltage of an external input signal received by the comparator 110 of the comparison control circuit 100 according to an embodiment of the present application. FIG. 2B illustrates a waveform diagram of the voltage of a clock of the comparator 110 of the comparison control circuit 100 according to an embodiment of the present application, wherein the clock of the comparator 110 is configured to trigger the comparator 110 to output the comparison signal. FIG. 2C illustrates a waveform diagram of the voltage of the comparison signal output by the comparator 110 of the comparison control circuit 100 according to an embodiment of the present application, wherein a waveform in a solid line represents the waveform of the comparison signal, and a waveform in a three-dotted chain line represents the waveform led by noise. In the waveform diagrams of the FIG. 2A, FIG. 2B and FIG. 2C, the horizontal axis represents time in nanoseconds (ns). The vertical axis represents the magnitude of voltage, and the unit is volts (V). In this embodiment, the first high voltage potential is 1 volt, and the first low voltage potential is 0 volt. The first input signal $V_{in1}$ is the external input signal, and the second input signal $V_{in2}$ is a comparison voltage potential $V_{com}$, wherein the value of the comparison voltage potential $V_{com}$ is 0.5 volts. When the value of the first input signal $V_{in1}$ (as illustrated in a dotted line L1 shown in FIG. 2A) received at the first input terminal 111 of the comparator 110 is greater than or equal to the second input signal $V_{in2}$, the clock of the comparator 110 will trigger the comparator 110 at the falling edge (as illustrated in a dotted line L1 shown in FIG. 2B), such that the comparator 110 outputs the first high voltage potential (as illustrated in a box R1 formed by a single-dotted chain shown in FIG. 2C) at the first output terminal 113. When the value of the first input signal $V_{in1}$ (as illustrated in a dotted line L2 shown in FIG. 2A) received at the first input terminal 11I of the comparator 110 is less than the second input signal $V_{in2}$, the clock of the comparator 110 will trigger the comparator 110 at the rising edge (as illustrated in a dotted line L2 shown in FIG. 2B), such that the comparator 110 outputs the first low voltage potential (as illustrated in a box R2 formed by a single-dotted chain shown in FIG. 2C) at the first output terminal 113.

The Schmitt trigger 120 is configured to output a trigger signal at the second output terminal 122 according to the comparison signal received at the third input terminal 121 and a voltage potential range, wherein the trigger signal is a second high voltage potential or a second low voltage potential. In some embodiments, the user can define the voltage potential range of the Schmitt trigger 120. In this embodiment, the voltage potential range of the Schmitt trigger 120 is in a range from the first low voltage potential to the first high voltage potential. When the value of the comparison signal received by the Schmitt trigger 120 is greater than or equal to the upper limit of the voltage potential range, the Schmitt trigger 120 outputs the second high voltage potential at the second output terminal 122. When the value of the comparison signal received by the Schmitt trigger 120 is within the voltage potential range (i.e., the value of the comparison signal is greater than or equal to the lower limit of the voltage potential range, and the value of the comparison signal is less than the upper limit of the voltage potential range), the Schmitt trigger 120 does not perform any action. When the value of the comparison signal received by the Schmitt trigger 120 is less than the lower limit of the voltage potential range, the Schmitt trigger 120 outputs the second low voltage potential at the second output terminal 122. In some embodiments, the second high voltage potential is 1 volt, and the second low voltage potential is 0 volt. Since the Schmitt trigger 120 has better noise immunity to analog signals, the noise generated by the power source or the noise of the comparison signal output by the comparator 110 can be effective against by disposing the Schmitt trigger 120 in the comparison control circuit 100, thereby avoiding problems during the operating process of the comparison control circuit 100.

The capacitor set 140 is configured to adjust the second input signal $V_{in2}$ when being controlled by the logic circuit 130. In some embodiments, the capacitor set 140 includes N capacitors $C_1$-$C_N$ and N switches $S_1$-$S_N$, wherein each of the capacitors $C_1$-$C_N$ has a first terminal and a second terminal. The first terminal of each of the capacitors $C_1$-$C_N$ is electrically connected to the second input terminal 112 of the comparator 110. The second terminal of each of the capacitors $C_1$-$C_N$ can be selectively electrically connected to a reference voltage source $V_{ref}$ or ground through the corresponding switch when being controlled. When a second terminal of a capacitor is electrically connected to the reference voltage source $V_{ref}$, the capacitor will be charged. When a second terminal of a capacitor is electrically connected to the ground, the capacitor will be discharged.

The logic circuit 130 is configured to control the capacitor set 140 according to the trigger signal to correspondingly adjust the comparison voltage potential $V_{com}$. In other words, the logic circuit 130 will control the corresponding switch(es) in the capacitor set 140 according to the value of the trigger signal. Then, the corresponding capacitor(s) will be electrically connected to the reference voltage source $V_{ref}$ or ground for charging or discharging. Finally, the capacitor set 140 will calculate an adjusted comparison voltage potential according to the capacitance of each capacitor and output the adjusted comparison voltage potential to the second input terminal 112 of the comparator 110.

Figure 3:
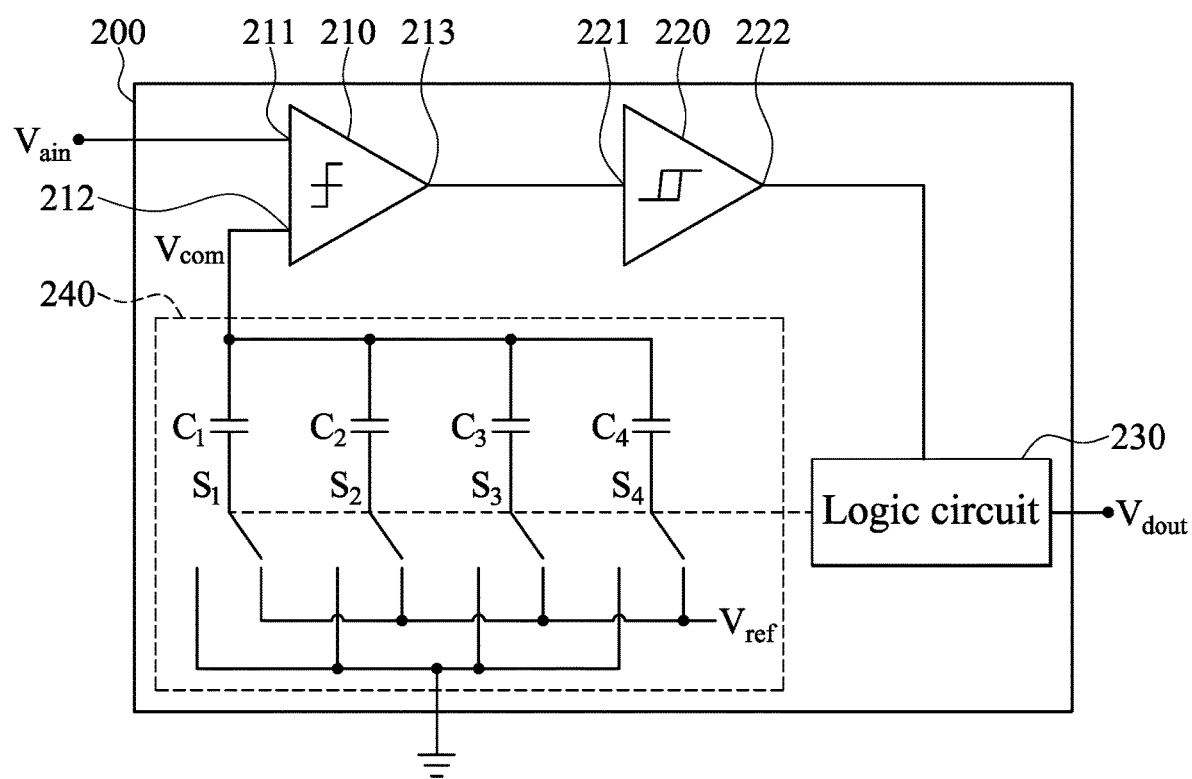
FIG. 3 illustrates a schematic circuit diagram of an analog-to-digital converter according to an embodiment of the present application.

In some embodiments, the structure of the comparison control circuit 100 can be applied in an analog-to-digital converter 200. Please refer to FIG. 3. FIG. 3 illustrates a schematic circuit diagram of the analog-to-digital converter 200 according to an embodiment of the present application. The analog-to-digital converter 200 includes a comparator 210, a Schmitt trigger 220, a logic circuit 230 and a capacitor set 240. As shown in FIG. 3, a third input terminal 221 of the Schmitt trigger 220 is electrically connected to a first output terminal 213 of the comparator 210, the logic circuit 230 is electrically connected to a second output terminal 222 of the Schmitt trigger 220, and the capacitor set 240 is electrically connected to a second input terminal 212 of the comparator 210 and the logic circuit 230. In this embodiment, the signal received at the first input terminal 211 of the comparator 210 is an analog input signal $V_{ain}$, the signal received at the second input terminal 212 of the comparator 210 is a comparison voltage potential $V_{com}$, and the signal received at the third input terminal 221 of the Schmitt trigger 220 is a comparison signal.

The analog-to-digital converter 200 is configured to convert the analog input signal $V_{ain}$ into a digital output signal with N bits. In some embodiments, the analog-to-digital converter 200 starts the conversion from the most significant bit (MSB) of the digital output signal and sequentially converts the remaining bits until the least significant bit (LSB) is converted, which complete a complete analog-to-digital conversion. In some embodiments, the analog-to-digital converter 200 outputs a digital output signal $V_{dout}$ through the logic circuit 230, wherein the logic circuit 230 is a successive approximation register (SAR).

The capacitor set 240 of the analog-to-digital converter 200 includes a plurality of switched capacitor groups. Each of the switched capacitor groups includes a capacitor and a switch in series, and each of the switched capacitor groups is in parallel with each other, wherein a parallel point of each switched capacitor group is electrically connected to the second input terminal 212 of the comparator 210. Each switch of the capacitor set 240 is electrically connected to a reference voltage source $V_{ref}$ or ground selectively when being controlled, wherein the reference voltage source $V_{ref}$ is a fixed voltage value. In some embodiments, the capacitance of the capacitor $C_i$ is twice the capacitance of the capacitor $C_{i+1}$, and the capacitance of the capacitor $C_{N-1}$ is equal to the capacitance of the capacitor $C_N$, wherein i=1~N−2. In some embodiments, the capacitor set 240 is a capacitive digital-to-analog converter, wherein the capacitive digital-to-analog converter converts a digital signal into an analog signal by using capacitors to store charges. For example, in this embodiment, the capacitor set 240 includes four capacitors $C_1$-$C_4$ and four switches S1-S4. If a digital signal received by the capacitor set 240 is (1100), the capacitors $C_1$ and $C_2$ are electrically connected to the reference voltage source $V_{ref}$, and the capacitors $C_1$ and $C_2$ are electrically connected to the ground. It is assumed that the value of the reference voltage source $V_{ref}$ is 1 volt and the capacitance of the capacitor $C_4$ is C. Since the total capacitance of the capacitors in parallel is equal to the sum of the capacitance of the capacitors, and the impedance of a capacitor is inversely proportional to its capacitance, the comparison voltage potential $V_{com}$ output by the capacitor set 240 to the comparator 210 is 0.75 volts. The formula is as follows:

$$V_{com} = \frac{4C+2C}{4C+2C+C+C} \times V_{ref} = \frac{3}{4}V_{ref}$$

Figure 4:
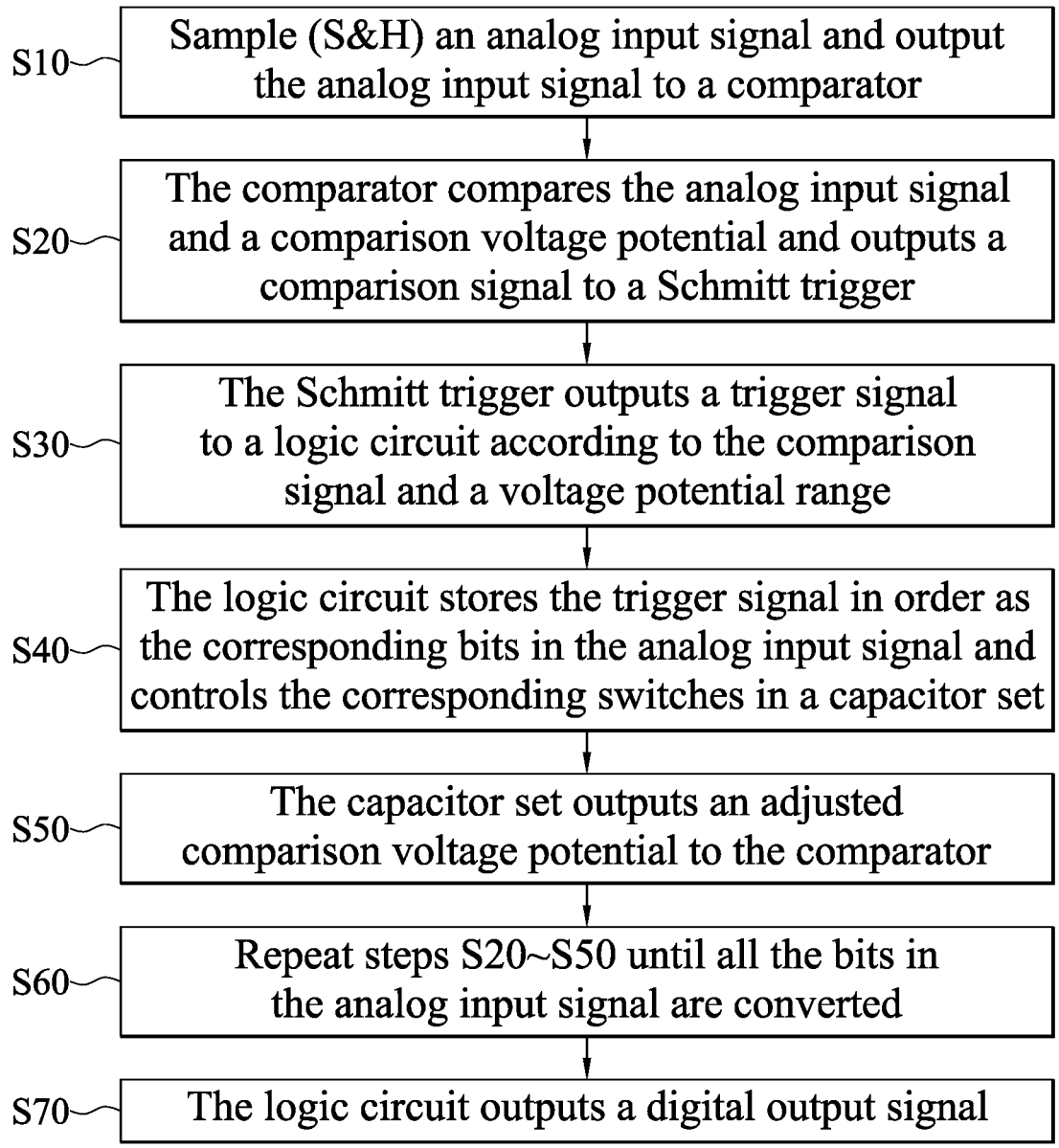
FIG. 4 illustrates a flow diagram of the operation of the analog-to-digital converter according to an embodiment of the present application.

Please refer to FIG. 4. FIG. 4 illustrates a flow diagram of the operation of the analog-to-digital converter 200 according to an embodiment of the present application. As shown in FIG. 4, when the analog input signal $V_{ain}$ is input to the analog-to-digital converter 200, the analog-to-digital converter 200 samples (Sample-and-Hold, S&H) the analog input signal $V_{ain}$, and inputs the analog input signal $V_{ain}$ to comparator 210. The purpose of sampling is to make the analog-to-digital converter 200 to maintain the consistency of the analog input signal $V_{ain}$ during the operating process, so as to avoid errors in the digital output signal $V_{dout}$. In step S20, the comparator 210 compares the analog input signal $V_{ain}$ of the first input terminal 211 and the comparison voltage potential $V_{com}$ of the second input terminal 212 and outputs, at the first output terminal 213, a comparison signal to the Schmitt trigger 220 of the analog-to-digital converter 200. In step S30, the Schmitt trigger 220 outputs, at the second output terminal 222, a trigger signal to the logic circuit 230 of the analog-to-digital converter 200 according to the comparison signal and a voltage potential range.

In step S40, the logic circuit 230 stores the trigger signal in order as the corresponding bits in the analog input signal $V_{ain}$ (from the most significant bit to the least significant bit). Then, the logic circuit 230 control the corresponding switch in the capacitor set 240 of the analog-to-digital converter 200 according to the trigger signal, such that the corresponding capacitor is electrically connected to the reference voltage source $V_{ref}$ or ground. For example, if the current conversion sequence is the second bit, it represents that the logic circuit 230 will store the trigger signal as the second valid bit of the analog input signal $V_{ain}$. If the value of the trigger signal is 1, the logic circuit 230 will control the switch $S_2$ of the capacitor set 240, such that the capacitor $C_2$ of the capacitor set 240 is electrically connected to the reference voltage source $V_{ref}$ for charging.

In step S50, the capacitor set 240 calculates an adjusted comparison voltage potential $V_{com}$ according to the capacitance of each capacitor and outputs the adjusted comparison voltage potential $V_{com}$ to the comparator 210. In step S60, the analog-to-digital converter 200 repeats steps S20-S50 to perform the next round of bit conversion until all the bits in the analog input signal $V_{ain}$ are converted, then proceeds to step S70. Since the magnitude of capacitance of each capacitor in the capacitor set 240 is different, the value of the comparison voltage potential $V_{com}$ output by the capacitor set 240 in each round of bit conversion is also different. With the proceeding of each round of bit conversion, the value of the comparison voltage potential $V_{com}$ received by the comparator 210 will gradually approach the value of the analog input signal $V_{ain}$. When the value of the comparison voltage potential $V_{com}$ received by the comparator 210 is equal to the value of the analog input signal $V_{ain}$, it represents that the analog-to-digital converter 200 has completely converted the analog input signal $V_{ain}$ into all bits of the digital output signal $V_{dout}$. Therefore, in step S70, the analog-to-digital converter 200 will output a digital output signal $V_{dout}$ through the logic circuit 230 and end the analog-to-digital conversion this time.

Figure 5:
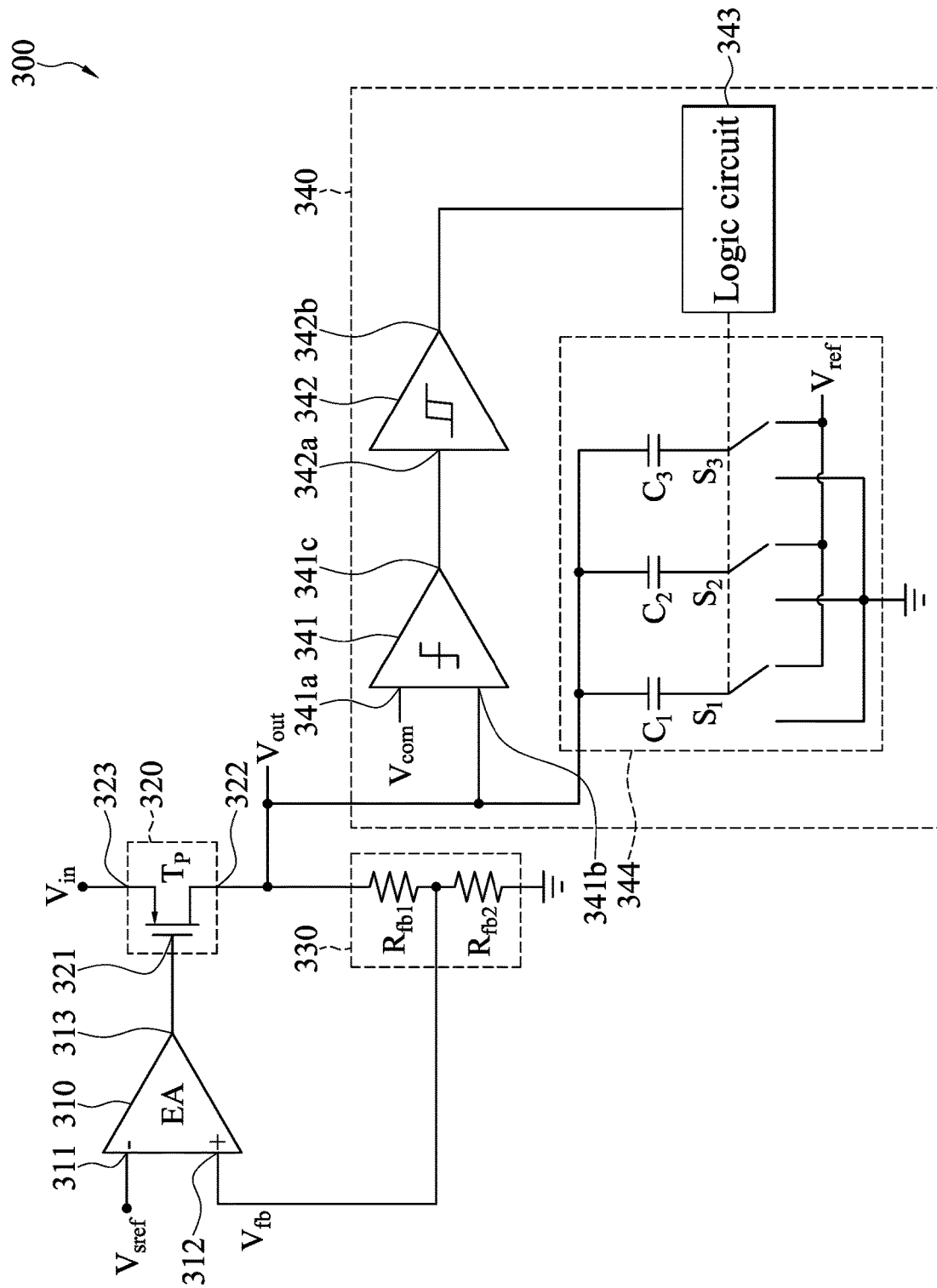
FIG. 5 illustrates a schematic circuit diagram of an analog low-dropout regulator according to an embodiment of the present application.

In another embodiment, the comparison control circuit 100 can also be applied in an analog low-dropout regulator 300. Please refer to FIG. 5. FIG. 5 illustrates a schematic circuit diagram of the analog low-dropout regulator 300 according to an embodiment of the present application. The analog low-dropout regulator 300 includes an error amplifier 310, a pass transistor 320, a voltage divider circuit 330 and a comparison control circuit 340. The error amplifier 310 has a positive input terminal 312, a negative input terminal 311 and a third output terminal 313. The pass transistor 320 has a gate terminal 321, a drain terminal 322 and a source terminal. The comparison control circuit 340 includes a comparator 341, a Schmitt trigger 342, a logic circuit 343 and a capacitor set 344. As shown in FIG. 5, the gate terminal 321 of the pass transistor 320 is electrically connected to the third output terminal 313 of the error amplifier 310, the voltage divider circuit 330 is electrically connected to the drain terminal 322 of the pass transistor 320 and the positive input terminal 312 of the error amplifier 310, and a second input terminal 341b of the comparator 341 is electrically connected to the drain terminal 322 of the pass transistor 320. In this embodiment, the signal received at a first input terminal 341a of the comparator 341 is the comparison voltage potential $V_{com}$, and the signal received at the second input terminal 341b of the comparator 341 is an output voltage $V_{out}$.

The error amplifier 310 is configured to output a control voltage at the third output terminal 313 according to a feedback voltage $V_{fb}$ received at the positive input terminal 312 and a stable reference voltage potential $V_{sref}$ received at the negative input terminal 311, wherein the control voltage is configured to control the voltage of the gate terminal 321 of the pass transistor 320. When the feedback voltage $V_{fb}$ is greater than the stable reference voltage potential $V_{sref}$, the error amplifier 310 will adjust the voltage of the gate terminal 321 of the pass transistor 320, so that the value of a current flowing through the pass transistor 320 decreases to reduce the output voltage $V_{out}$. When the feedback voltage Vie is less than the stable reference voltage potential $V_{sref}$, the error amplifier 310 will adjust the voltage of the gate terminal 321 of the pass transistor 320, so that the value of the current increases to increase the output voltage $V_{out}$.

The pass transistor 320 is configured to output the output voltage $V_{out}$ at the drain terminal 322 according to the control voltage received at the gate terminal 321. In some embodiments, the pass transistor 320 receives an input voltage $V_{in}$ at the source terminal 323. When the gate terminal 321 of the pass transistor 320 receives the control voltage from the error amplifier 310, the pass transistor 320 outputs the output voltage $V_{out}$ at the drain terminal 322, wherein the value of the input voltage $V_{in}$ is greater than the value of the output voltage $V_{out}$. In some embodiments, the pass transistor 320 is a PMOS (p-channel metal oxide semiconductor).

The voltage divider circuit 330 is configured to divide the output voltage $V_{out}$ and the feedback voltage $V_{fb}$, such that the value of the feedback voltage $V_{fb}$ is the same as the value of the stable reference voltage potential $V_{sref}$, further such that the value of the output voltage $V_{out}$ is the same as the value of the stable reference voltage potential $V_{sref}$, wherein the stable reference voltage potential $V_{sref}$ is a fixed voltage not affected by temperature or signal noise. In some embodiments, the voltage divider circuit 330 includes a first voltage dividing resistor $R_{fb1}$ and a second voltage dividing resistor $R_{fb2}$, wherein the resistance of the first voltage dividing resistor $R_{fb1}$ is much smaller than the resistance of the second voltage dividing resistor $R_{fb2}$. It is assumed that the error amplifier 310 is an ideal amplifier, the value of the output voltage $V_{out}$ is the same as the value of the stable reference voltage potential $V_{sref}$ can be calculated, and the formula is as follows:

$$V_{out} = I \times (R_{fb1} + R_{fb2}) = V_{fb} \times \left(1 + \frac{R_{fb1}}{R_{fb2}}\right) = V_{sref}, \text{ wherein}$$

$$I = \frac{V_{fb}}{R_{fb2}}, V_{fb} = V_{sref}, R_{fb1} \ll R_{fb2}$$

In some embodiments, the comparison control circuit 340 is configured to stabilize the output voltage $V_{out}$. When the pass transistor 320 outputs an output voltage $V_{out}$ at the drain terminal 322, the output voltage $V_{out}$ becomes more stable by being adjusted through the comparison control circuit 340. In some embodiments, the output voltage $V_{out}$ is input to the comparison control circuit 340 through the second input terminal 341b of the comparator 341, and the output voltage $V_{out}$ is compared with comparison voltage potential $V_{com}$ received at the first input terminal 341a of the comparator 341. When the value of the output voltage $V_{out}$ is greater than the comparison voltage potential $V_{com}$, the comparison control circuit 340 control the capacitor set 344 through the logic circuit 343 to reduce the value of the output voltage $V_{out}$ to the comparison voltage potential $V_{com}$. When the value of the output voltage $V_{out}$ is less than the comparison voltage potential $V_{com}$, the comparison control circuit 340 control the capacitor set 344 through the logic circuit 343 to increase the value of the output voltage $V_{out}$ to the comparison voltage potential $V_{com}$. In some embodiments, the comparison voltage potential $V_{com}$ received at the first input terminal 341a of the comparator 341 is equal to the stable reference voltage potential $V_{sref}$.

In some embodiments, the user can define the number of capacitors in the capacitor set 344 and the capacitance of each capacitor according to the value of the output voltage $V_{out}$. If the more number of capacitors in the capacitor set 344, it represents that the voltage value output by the capacitor set 344 will have more variations; and if the less number of capacitors in the capacitor set 344, it represents that the voltage value output by the capacitor set 344 will have fewer variations. If the more capacitance of a capacitor, it represents that the voltage range output by the capacitor set 344 will be larger; if the less capacitance of a capacitor, it represents that the voltage range output by the capacitor set 344 will be smaller. For example, if the value of the output voltage $V_{out}$ is small (e.g., the value of the output voltage $V_{out}$ is 1 volt), the user can set a smaller number of capacitors with smaller capacitance in the capacitor set 344 to save cost.

Figure 6:
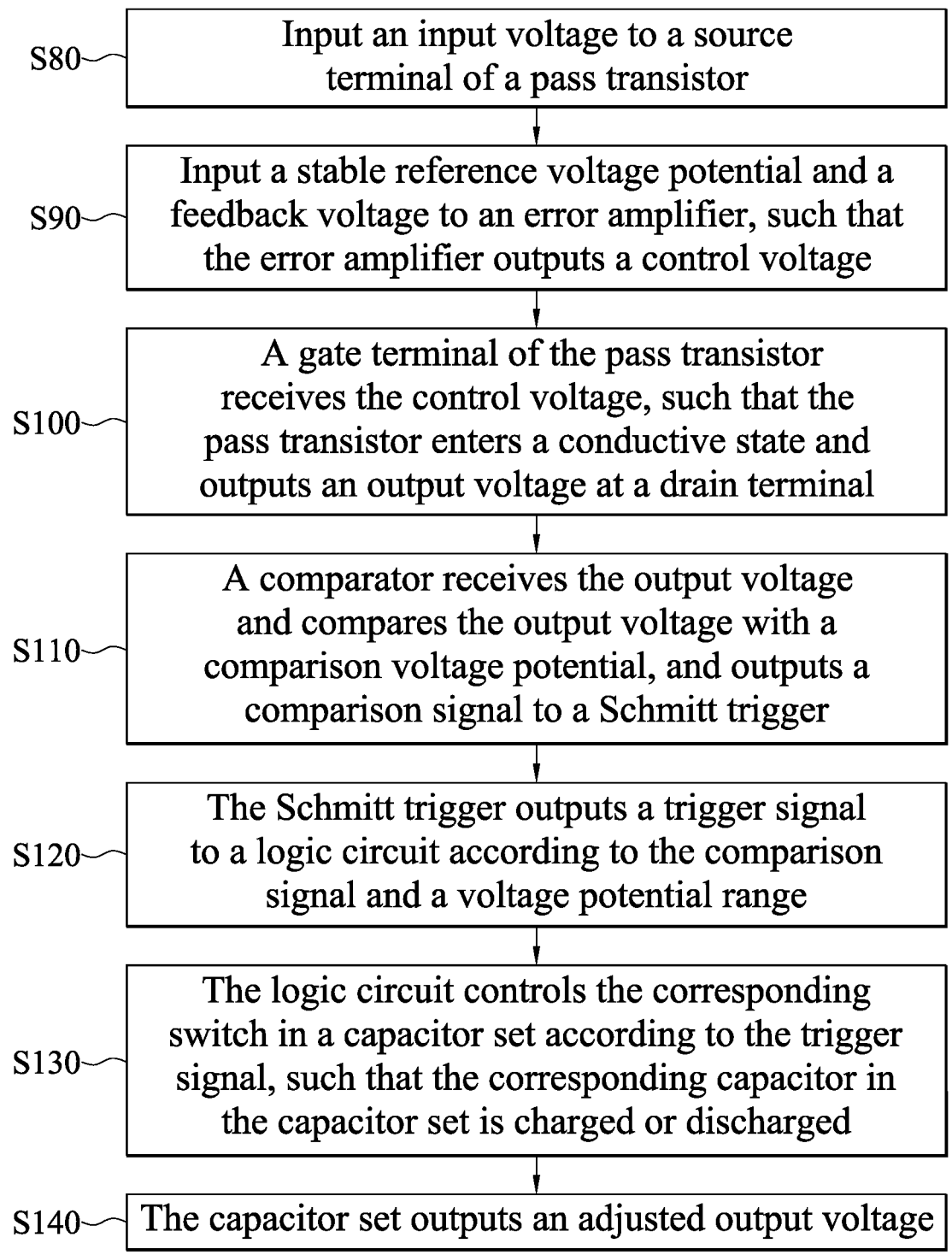
FIG. 6 illustrates a flow diagram of the operation of the analog low-dropout regulator according to an embodiment of the present application.

Please refer to FIG. 6. FIG. 6 illustrates a flow diagram of the operation of the analog low-dropout regulator 300 according to an embodiment of the present application. As shown in FIG. 6, in step S80, the analog low-dropout regulator 300 inputs an input voltage $V_{in}$ to the source terminal 323 of the pass transistor 320. In step S90, the analog low-dropout regulator 300 respectively inputs a stable reference voltage potential $V_{sref}$ and a feedback voltage $V_{fb}$ to the negative input terminal 311 and the positive input terminal 312. At this time, the error amplifier 310 outputs a control voltage to the gate terminal 321 of the pass transistor 320 according to the stable reference voltage potential $V_{sref}$ and the feedback voltage $V_{fb}$. In step S100, the gate terminal 321 of the pass transistor 320 receives the control voltage, such that the pass transistor 320 enters a conductive state and outputs an output voltage $V_{out}$ at the drain terminal 322. At this time, if the value of the output voltage $V_{out}$ is not equal to the stable reference voltage potential $V_{sref}$, the analog low-dropout regulator 300 adjusts the output voltage $V_{out}$ through the voltage divider circuit 330 and the error amplifier 310, such that the value of the output voltage $V_{out}$ is equal to the stable reference voltage potential $V_{sref}$.

In step S110, when the value of the output voltage $V_{out}$ is equal to the stable reference voltage potential $V_{sref}$, the comparator 341 of the comparison control circuit 340 receives the output voltage $V_{out}$ through the second input terminal 341b and outputs, according to the output voltage $V_{out}$ and the comparison voltage potential $V_{com}$ received at the first input terminal 341a, a comparison signal at the first output terminal 341c to the third input terminal 342a of the Schmitt trigger 340. In step S120, the Schmitt trigger 342 outputs, according to the comparison signal and a voltage potential range, a trigger signal to the logic circuit 343 of the comparison control circuit 340 at the second output terminal 342b. In step S130, the logic circuit 343 controls the corresponding switch in the capacitor set 344 of the comparison control circuit 340 according to the trigger signal, such that the corresponding capacitor in the capacitor set 344 is charged or discharged. Finally, in step S140, the capacitor set 344 calculates an adjusted output voltage $V_{out}$ according to the capacitance of each capacitor and outputs it.

To sum up, according to some embodiments of the comparison control circuit 100, even if the input signal or power signal in various types of circuits is mixed with noise, these circuits can immune the noise through the comparison control circuit 100, thereby avoiding operation failure or to output wrong results. For example, applying the structure of the comparison control circuit 100 in the analog-to-digital converter 200 can make the analog-to-digital converter 200 outputting a more accurate digital output signal $V_{dout}$. The analog low-dropout regulator 300 can adjust the output voltage $V_{out}$ through the comparison control circuit 340, such that the output voltage $V_{out}$ becomes more stable.

Although the present application has been disclosed by the embodiments as aforementioned, it is not intended to limit the creation of the present application. Those skilled in the art may make some modifications and changes without departing from the spirit and scope of the present application, but such modifications and changes are still within the scope of the present application.

What is claimed is:

1. An analog low-dropout regulator, comprising:
   an error amplifier, having a positive input terminal, a negative input terminal and a third output terminal, the error amplifier is configured to output a control voltage at the third output terminal according to a feedback voltage received at the positive input terminal and a stable reference voltage potential received at the negative input terminal;
   a pass transistor, having a gate terminal, a drain terminal and a source terminal, the pass transistor is configured to output an output voltage at the drain terminal according to the control voltage received at the gate terminal;
   a voltage divider circuit, configured to divide the output voltage and the feedback voltage, such that a value of the feedback voltage is the same as the stable reference voltage potential, thereby a value of the output voltage is the same as the stable reference voltage potential; and
   a comparison control circuit, comprising:
      a single comparator, having a first input terminal, a second input terminal and a first output terminal, the single comparator receives a first input signal at the first input terminal and receives a second input signal at the second input terminal, the comparator is configured to compare the first input signal and the second input signal and to output a comparison signal at the first output terminal, wherein the comparison signal is a first high voltage potential or a first low voltage potential;
      a single Schmitt trigger, having a third input terminal and a second output terminal, the single Schmitt trigger is configured to output a trigger signal at the second output terminal according to the comparison signal received at the third input terminal and a voltage potential range, wherein the trigger signal is a second high voltage potential or a second low voltage potential, and the voltage potential range is in a range from the first low voltage potential to the first high voltage potential;
      a capacitor set, configured to adjust the second input signal when being controlled; and
      a logic circuit, configured to control the capacitor set according to the trigger signal to correspondingly adjust the second input signal;
      wherein the second input terminal is electrically connected to the drain terminal.

2. The analog low-dropout regulator according to claim 1, wherein the voltage divider circuit comprises a first voltage dividing resistor and a second voltage dividing resistor, and wherein a resistance of the first voltage dividing resistor is much smaller than a resistance of the second voltage dividing resistor.

3. The analog low-dropout regulator according to claim 1, wherein the comparator is a comparator with single-ended input.

4. The analog low-dropout regulator according to claim 1, wherein the first high voltage potential is 1 volt (V), and the first low voltage is 0 volt (V).

5. The analog low-dropout regulator according to claim 1, wherein the second high voltage potential is 1 volt (V), and the second low voltage is 0 volt (V).

6. The analog low-dropout regulator according to claim 1, wherein the capacitor set comprises a plurality of capacitors from $C_1$ to $C_N$, and wherein each of the plurality of capacitors has a first terminal and a second terminal.

7. The analog low-dropout regulator according to claim 6, wherein the first terminal of each of the plurality of capacitors is electrically connected to the second input terminal, and the second terminal of each of the plurality of capacitors is electrically connected to a reference voltage source or a ground selectively when being controlled.

\* \* \* \* \*